United States Patent
Liu et al.

(10) Patent No.: US 11,956,971 B2
(45) Date of Patent: Apr. 9, 2024

(54) COOLING FOR PMA (PERPENDICULAR MAGNETIC ANISOTROPY) ENHANCEMENT OF STT-MRAM (SPIN-TORQUE TRANSFER-MAGNETIC RANDOM ACCESS MEMORY) DEVICES

(71) Applicant: Taiwan Semiconductor Manufacturing Company, Ltd., Hsinchu (TW)

(72) Inventors: Huanlong Liu, Sunnyvale, CA (US); Guenole Jan, San Jose, CA (US); Ru-Ying Tong, Los Gatos, CA (US); Jian Zhu, San Jose, CA (US); Yuan-Jen Lee, Fremont, CA (US); Jodi Mari Iwata, San Carlos, CA (US); Sahil Patel, Fremont, CA (US); Vignesh Sundar, Fremont, CA (US)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 285 days.

(21) Appl. No.: 17/027,330

(22) Filed: Sep. 21, 2020

(65) Prior Publication Data
US 2021/0013260 A1    Jan. 14, 2021

Related U.S. Application Data

(63) Continuation of application No. 16/184,518, filed on Nov. 8, 2018, now Pat. No. 10,784,310.

(51) Int. Cl.
*H10B 61/00* (2023.01)
*H10N 50/01* (2023.01)
(Continued)

(52) U.S. Cl.
CPC ............ *H10B 61/00* (2023.02); *H10N 50/01* (2023.02); *H10N 50/10* (2023.02); *H10N 50/80* (2023.02); *H10N 50/85* (2023.02)

(58) Field of Classification Search
CPC ........ H01L 43/08–12; H01L 21/67109; H01F 10/3272; H01F 10/3277
See application file for complete search history.

(56) References Cited

U.S. PATENT DOCUMENTS 6,802,935 B2   10/2004   Cheng et al.
9,245,549 B2    1/2016   Nishioka et al.
(Continued)

FOREIGN PATENT DOCUMENTS

JP      2006286669 A  * 10/2006
KR   10-2019-0140147     11/2019

OTHER PUBLICATIONS

German Examination Report with English translation, dated Apr. 13, 2021, 14pages.

*Primary Examiner* — Alia Sabur
(74) *Attorney, Agent, or Firm* — HAYNES AND BOONE, LLP

(57) ABSTRACT

A fabrication process for an STT MTJ MRAM device includes steps of cooling the device at individual or at multiple stages in its fabrication. The cooling process, which may be equally well applied during the fabrication of other multi-layered devices, is demonstrated to produce an operational device that is more resistant to adverse thermal effects during operation that would normally cause a similar device not so fabricated to lose stored data and otherwise fail to operate properly.

20 Claims, 3 Drawing Sheets

(51) Int. Cl.
*H10N 50/10* (2023.01)
*H10N 50/80* (2023.01)
*H10N 50/85* (2023.01)

(56) References Cited

U.S. PATENT DOCUMENTS

| | | | |
|---|---|---|---|
| 9,590,010 B1* | 3/2017 | Gottwald | H01L 27/228 |
| 9,761,795 B2 | 9/2017 | Park et al. | |
| 10,468,592 B1 | 11/2019 | Xue et al. | |
| 10,784,310 B2* | 9/2020 | Liu | H01L 43/12 |
| 2001/0000747 A1* | 5/2001 | White | H01L 21/67748 |
| | | | 432/184 |
| 2008/0102315 A1 | 5/2008 | Fukuzawa et al. | |
| 2010/0242837 A1 | 9/2010 | Goto et al. | |
| 2012/0205757 A1 | 8/2012 | Zhang et al. | |
| 2012/0295370 A1 | 11/2012 | Zhou et al. | |
| 2013/0216702 A1 | 8/2013 | Kaiser et al. | |
| 2013/0224521 A1 | 8/2013 | Wang et al. | |
| 2015/0380026 A1* | 12/2015 | Zheng | G11B 5/3163 |
| | | | 360/99.08 |
| 2016/0099288 A1 | 4/2016 | Watanabe et al. | |
| 2016/0130693 A1 | 5/2016 | Sawada et al. | |
| 2016/0141496 A1* | 5/2016 | Park | G11C 11/161 |
| | | | 438/3 |
| 2017/0110657 A1 | 4/2017 | Park et al. | |
| 2018/0261478 A1* | 9/2018 | Ueda | G05D 7/0641 |
| 2020/0152698 A1 | 5/2020 | Liu et al. | |

* cited by examiner

COOLING FOR PMA (PERPENDICULAR MAGNETIC ANISOTROPY) ENHANCEMENT OF STT-MRAM (SPIN-TORQUE TRANSFER-MAGNETIC RANDOM ACCESS MEMORY) DEVICES

This application is a continuation application of U.S. patent application Ser. No. 16/184,518, filed Nov. 8, 2018, the disclosure of which is herein incorporated by reference in its entirety.

BACKGROUND

1. Field of the Invention

This invention relates generally to a spin-torque transfer random access memory (STT-MRAM) device and to the application of thermal cooling to fabrication processes as a method of improving device performance.

2. Description

A critical aspect of MRAM performance is thermal stability, the ability of a device to maintain stored information stable against temperature variations without refreshing or other external help. It is especially important as the MTJ (magnetic tunnel junction) unit cell size scales down for advanced CMOS (complementary metal-oxide semiconductor) technology nodes since the thermal stability is proportional to the MTJ size in theory and positively correlated with the MTJ size in reality. In addition, some standard semiconductor assembly processes will expose the CMOS chips to high temperatures (260 C for example), with which MRAM, as a candidate for embedded memories, needs to comply. At such temperatures, the traditional thinking that thermal stability is solely the requirement of the free layer of a MTJ no longer applies. First, the temperature dependence of the thermal MTJ stability can be different for the free layer and the pinned layer as they may consist of different materials. Since the fabrication processing temperature is so much above the normal temperature range for typical data retention concerns, one cannot say the pinned layer has better thermal stability than free layer simply because it is within chip working temperature range (typically less than 125 C or 150 C) without additional study. More importantly, the free layer is normally at or near a balanced dipole field from the Synthetic Anti-Ferromagnetic (SAF) pinned layer, whereas the pinned layer is not. As temperature increases and coercivity field decreases, the difference between balanced and unbalanced dipole field can have a big influence on the thermal stability. As a result, one needs to consider thermal stabilities for both the free layer and pinned layer for embedded MRAM applications that follow the standard semiconductor product procedures.

As the film stacks for working MRAMs become more and more complicated and each functional layer tends to be formed of multiple layers of different materials for better performance, a single stack layer (i.e. a layer deposited using one set of deposition tool parameters, including targets, chamber pressure, gases and flow rates) is often ultra-thin, consisting only a few mono-atomic layers (a few Angstroms) of certain materials deposited across a 200 mm~300 mm wafer. At this level, the films deposited in the MTJ stack have quite different properties than bulk materials and the deposition conditions can significantly change the morphology of the film, thus impacting the total MTJ performance, including thermal stability.

The conventional magnetic tunneling junction (MTJ) device is a form of ultra-high magnetoresistive device in which the relative orientation of the magnetic moments of parallel, vertically separated, upper and lower magnetized layers controls the flow of spin-polarized electrons tunneling through a very thin dielectric layer (the tunneling barrier layer) formed between those layers. When injected electrons pass through the upper layer their spins are polarized by interaction with the magnetic moment of that layer. The majority of the electrons emerge polarized in the direction of the magnetic moment of the upper layer, the minority being polarized opposite to that direction. The probability of such a polarized electron then tunneling through the intervening tunneling barrier layer into the lower layer then depends on the availability of states within the lower layer that the tunneling electron can occupy. This number, in turn, depends on the magnetization direction of the lower electrode. The tunneling probability is thereby spin dependent and the magnitude of the current (tunneling probability times number of electrons impinging on the barrier layer) depends upon the relative orientation of the magnetizations of magnetic layers above and below the barrier layer. The MTJ device can therefore be viewed as a kind of multi-state resistor, since different relative orientations (e.g. parallel and antiparallel) of the magnetic moments will change the magnitude of a current passing through the device. In a common type of device configuration (spin filter), one of the magnetic layers has its magnetic moment fixed in direction (pinned) by exchange coupling to an antiferromagnetic layer, while the other magnetic layer has its magnetic moment free to move (the free layer). The magnetic moment of the free layer is then made to switch its direction from being parallel to that of the pinned layer, whereupon the tunneling current is large, to being antiparallel to the pinned layer, whereupon the tunneling current is small. Thus, the device is effectively a two-state resistor. The switching of the free layer moment direction (writing) is accomplished by external magnetic fields that are the result of currents passing through conducting lines adjacent to the cell.

One of the deposition parameters that greatly influences the film property is the temperature of the wafer, which is a result of the fact that films grown on the wafer are generally the product of sputtering of various atomic species onto that wafer. When the sputtered species arrive at a cold surface, they tend to move and (or) penetrate less and vice-versa for arrival at a hot surface. Therefore, the result of the sputtering process depends on the affinity of the material being deposited and the material previously deposited. Using this fact, one can "tune" or adjust the wafer temperature to obtain some desired morphology (coverage, grain size, etc.) for the newly deposited film. This understanding leads us to the proposition that the very factors that challenge thermal stability of an operating device also play a role in the factors that affect the fabrication of that device. This understanding has led us and some of those in the prior art to suggest that thermal conditions that exist during device fabrication can affect the thermal stability of the final fabricated device. Examples of prior art attempts to regulate thermal conditions during fabrication to mitigate poor operational characteristics in the final device include the following.

U.S. Pat. No. 9,761,795 (Park et al.) discloses cooling a substrate in a cooling chamber to 50-300 K after the pinned layer is formed and before the MgO layer is formed. Cooling is by introducing a refrigerant into the chamber.

U.S. Patent Application 2013/0216702 (Kaiser et al.) teaches cooling a substrate in a cooling chamber to 50-293 K before or after part of the free layer has been formed.

U.S. Patent Application 2016/0130693 (Sawada et al) teaches cooling a substrate in a cooling chamber to room temperature before depositing a tunnel barrier layer.

U.S. Application 2016/0099288 (Watanabe et al) states that it is desirable for a cooling process to be performed before formation of the recording layer.

We have found that none of these approaches produce the results of the method to be disclosed herein.

SUMMARY

A first object of this disclosure is to provide an MRAM device with improved stability under thermal variations, i.e. the ability to maintain storage of data without refreshing cycles or other external assistance.

A second object of this disclosure is to provide such an MRAM device by means of a method of fabrication that lowers temperatures of the device being fabricated during certain portions of the fabrication process.

A third object of this disclosure is to address the issue of thermal stability by application of processing methods that will have the most advantageous affects on the properties of the thin films that are deposited on the wafers.

As we have noted above, one of the deposition parameters that greatly influences the film property is the temperature of the wafer. When a sputtered species arrives at a cold surface, it tends to move and (or) penetrate the surface less and vice-versa for arrival at a hot surface. Therefore, the result of the sputtering process depends on the affinity of the material being deposited and the material previously deposited. Using this fact, one can "tune" or adjust the wafer temperature to obtain some desired morphology (coverage, grain size, etc.) for the newly deposited film.

We find that by depositing part of the pinned layer at cool temperature in one of our presently used stacks, the thermal stability of the pinned layer, and therefore that of the chip as a whole, increases significantly and measurably.

This cooling is achieved inside a special cooling chamber within the deposition tool. After the initial part of the pinned layer deposition, the wafer is transferred in ultra-vacuum to the cooling chamber. It is then clamped to a cold stage (60 K) inside the chamber for certain period of time. The actual wafer temperature will decrease in the beginning of this process and reach a steady temperature close to that of the stage after approximately 200 s. Then the wafer is quickly transferred, while still in the ultra-vacuum, to the deposition chamber for the rest of the pinned layer deposition. The wafer temperature will slowly increase while still remaining cold during the rest of the pinned layer deposition.

DETAILED DESCRIPTION

A preferred embodiment of the present disclosure is the fabrication of an exemplary STT MTJ MRAM cell fabricated with the imposition of temperature reduction (i.e., cooling) during any individual one of several steps in the process, or during several of the steps. We note that the process is by no means limited to the fabrication of an exemplary device such as this cell, but this particular device is one of importance in the industry and includes many commonly applied fabrication techniques, so the cooling process can be widely tested. The MRAM exemplary device is an MTJ layered structure (an unpatterned stack) that, upon completion, comprises the sequence of deposited layers shown schematically in FIG. 1. In FIGS. 2-8 we will describe and illustrate the nature of the individual deposition and cooling processes that ultimately create the stack in FIG. 1. We limit the fabrication process to be described using FIGS. 2-8 below to the application of a cooling step at one particular point in the fabrication, which is a step during the formation of the AP1 layer in a SAF (Synthetic Antiferromagnetic) pinned layer. In this step, the AP1 layer is being formed as two successively deposited layers, 44 and 42, and a cooling step is performed on layer 42 so that layer 44 can be deposited on cooled layer 42. It is to be understood that the cooling step can be performed at many other stages in the fabrication and the figures describing them would only differ in where the step is performed.

Figure 1:
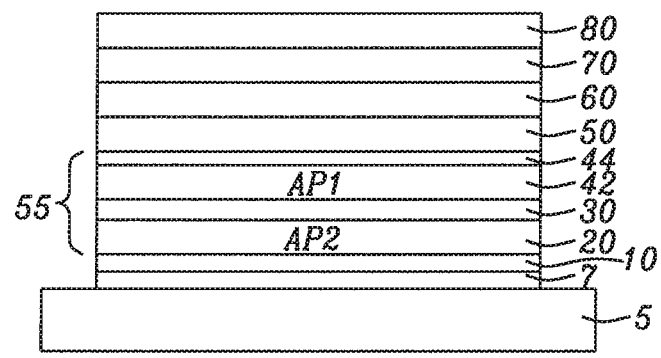
FIG. 1 is a schematic representation of an MTJ MRAM stack that has been fabricated using the cooling process described herein.

Referring then to FIG. 1, there is shown, schematically, the following final sequence of fabricated layers, whose individual properties will be discussed below. A wafer substrate 5 is provided as the base upon which the subsequent layers are fabricated. The substrate has been patterned (patterning not shown) to provide a surface region on which to fabricate the subsequent layers. The substrate will be removably affixed to various stages in the sputtering/deposition subsystem of a vacuum-sealed multi-chamber system that includes separate chambers configured for various types of depositions and processing. The multi-chamber system also includes a temperature-reducing thermal processing subsystem. We will describe this system in a bit more detail below.

On the substrate 5 there is formed a layer 7 of Ta or a conducting nitride such as TiN that is then surrounded by SiO2 and the whole is smoothed by a CMP (chemical mechanical polishing) process. This will afford a good contact for a subsequently deposited seed layer 10, on which is further formed a synthetic anti-ferromagnetically coupled (SAF) pinned layer 55, whose coupling is maintained by the RKKY (Ruderman-Kittel-Kasuya-Yosida) interaction. This coupled pinned layer system 55 itself comprises three layers: lower layer AP2, 20, RKKY interaction (or coupling) layer 30 and upper double layer AP1, 42/44. Note that AP1 layer is here formed of two sequentially deposited layers, denoted 42 and 44 which will be discussed further with respect to FIG. 4A-4C, below. The magnetic moments of layers AP1 and AP2 are held in an antiparallel configuration, perpendicularly to their planes of formation by the action of the RKKY interaction, which is facilitated by coupling layer 30 whose effect to couple magnetic moments between adjacent magnetic layers is well known in the art. The designation, using the terms AP1 and AP2 to the two layers, is simply to indicate, by the numeral "1", the closeness of AP1 to the tunneling barrier layer, 50, which in this example is a layer of MgO formed on layer AP1, but other metal oxides are possible. Layer AP2 is further from layer 50. Next, a ferromagnetic free layer 60 is formed on the tunneling barrier layer; following which a MgO capping layer 70 is formed on the free layer and a hard mask layer 80 is formed on the capping layer, the hard mask layer to be used in subsequent patterning steps of the completed stack. As stated above, these individual layers are successively formed by sputtering processes inside a multi-chamber system in which one chamber is dedicated to cooling the wafer with no sputtering/deposition capability and several other chambers are used for specific sputtering/deposition processes. The cooling process is carried out by transferring the fabrication to the cooling chamber, when cooling is desired, and attaching it by clamps to a metal stage which is temperature-fixed at 60K by flowing Ar gas at that temperature on it. This is illustrated in FIG. 4B below. Cooling of the fabrication occurs quickly by contact with the stage and, in the present process occurs in 200 seconds and stabilizes thereafter. When the cooled temperature is achieved, the fabrication is transferred to the specific separate chamber in which the deposition is to be carried out at ambient. It is noted that the system being used for these processes is commercially available (CANON ANELVA C7100) and it provides for easy transference between the cooling chamber and any one of the deposition chambers. Basically, the system, which is not shown, consists of a central transfer unit from which six satellite chambers radiate out, wherein one satellite chamber provides a cooling facility and the remainder provide facilities for producing various layer depositions. When the fabrication is transferred to the cooling chamber it is clamped to a metal stage on which a good thermal contact is made and the entire fabrication is then cooled by a gas transfer process. When the fabrication reaches the desired temperature, it is removed and transferred to one of the deposition chambers where it is re-fastened to a chuck and the required deposition proceeds while the fabrication remains well within a desired cooled temperature range. Once placed in a chamber in which the deposition process is to occur, the fabrication is no longer being actively cooled so its temperature will slowly rise to ambient. However, because of the slow rise of temperature, the deposition process is effectively carried out on the fabrication at the desired low temperature (60K here). The system and others like it are known in the art, so no further detailed description will be provided herein.

Figure 2:
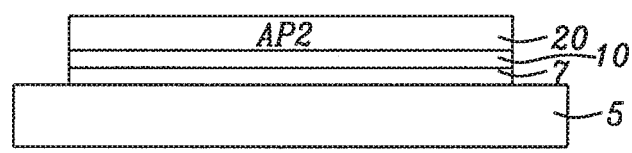
FIG. 2 is a schematic representation showing the first step in the fabrication of the MTJ MRAM stack of FIG. 1.

Referring now to FIG. 2, there is schematically illustrated the first step in a series of fabrication processes that are occurring within the multi-chamber system described above within which all processes can be maintained under vacuum and, where necessary, temperature-controlled conditions. Note that each cooling step occurs in the cooling chamber of the system. We begin our description of this exemplary process with the cooling being carried out only at one particular step in the overall fabrication. This single cooling step process can also be applied at other points in the fabrication, and will also be described. In addition, several cooling steps during a single fabrication can also be applied. After the fabrication is affixed to a stage in the cooling chamber (shown in FIG. 4B) and cooled, it is transferred back to a chamber at ambient temperature that is designed for whatever deposition process then occurs. The deposition process is, therefore, applied to the fabrication that is already cold, but is no longer actively being cooled.

Referring back to FIG. 2, a substrate 5 is provided that has been patterned (not shown here) to create a surface region on which the MTJ stack will be fabricated. On this patterned substrate 5, a layer 7 of Ta or the conducting nitride TiN is deposited by sputtering with a thickness of a few hundred Angstroms (A) with 400 A being typical. The surrounding region is filled with SiO2 and the entire region is then smoothed with an oxide CMP process. A seed layer 10 of NiCr between approximately 30 A and 100 A thickness is then deposited on layer 7 which will seed AP2 layer 20, which is a repeated Co/X multilayer, with good lattice growth along the (111) direction. Here X can be chosen from Ni, Pt or Pd, and the individual layers (i.e., Co, X) are typically between approximately 1 A and 10 A in thickness. This multilayered structure will provide PMA (perpendicular magnetic anisotropy) for the entire stack as a result of the repeated interfacial interactions between the layers. In addition, as a result of the RKKY interaction, the AP2 layer will couple anti-ferromagnetic ally with the AP1 layer, producing oppositely directed magnetic moments perpendicular to their planes of deposition.

Figure 3:
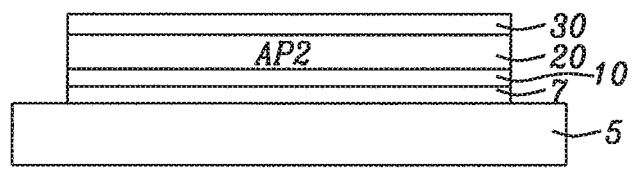
FIG. 3 is a schematic representation showing the second step in the fabrication of the MTJ MRAM stack of FIG. 1.

Referring now to FIG. 3, we see the deposition of the RKKY interaction layer 30, which may be a layer of Ru of thickness between approx. 3.5 and 4 A, Jr of thickness between approx. 4.5 and 5.5 A or Mo of thickness between approx. 5 and 6 A, which provides the anti-ferromagnetic coupling interaction between the AP2 and AP1 layers that results in an antiparallel orientation of their magnetic moments.

Figure 4A:
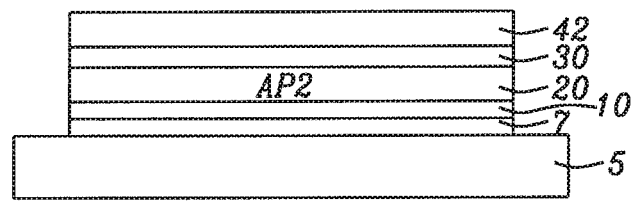
FIGS. 4A-4C are a schematic representation showing three successive processes required to form a layer on the cooled fabrication during the third step in the fabrication of the MTJ MRAM stack of FIG. 1.
Figure 4B:
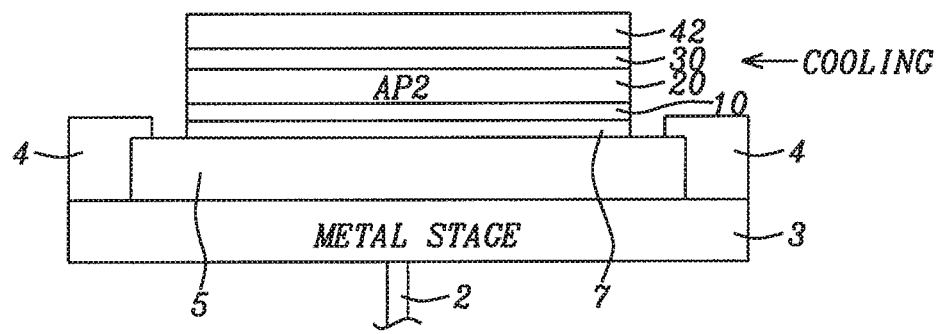
Figure 4C:
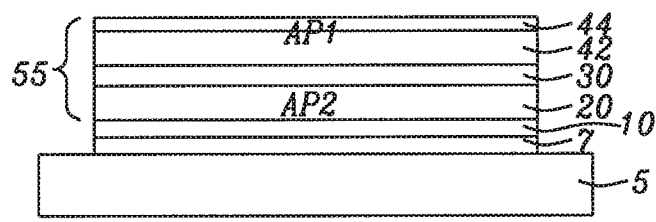

Referring next to FIGS. 4A-4C, there is shown the fabrication of the AP1 layer, which is here formed as the following two layers:
  (i) a thin, phase-breaking generally amorphous layer 42 at the bottom to break the (111) crystal structure of the AP2 layer from the (001) crystal structure of the rest of the [AP1/MgO barrier/free layer] structure, while they remain magnetically connected through the RKKY interaction, and
  (ii) a CoFeB layer 44 at the top that will contact the MgO barrier layer 50.

Referring first to FIG. 4A there is shown the formation of layer 42, as in (i) above, while the fabrication remains at ambient temperature in the chamber in which layer 30 has been formed.

Referring next to FIG. 4B there is shown the fabrication, now including just-deposited layer 42, transferred to the cooling chamber, wherein the fabrication is placed on a metal stage 3, removably clamped to the stage 4 and cooled by thermal contact to that stage, which is itself cooled by a gas flow 2, to the desired 60K temperature.

Referring now to FIG. 4C, there is shown the cooled fabrication, now shown transferred back to a deposition chamber at ambient temperature, within which layer 44, as in (ii) above, is now deposited.

The fabrication returns very slowly to ambient during deposition so layer 44 is indeed formed on a cold layer 42. The temperature of the wafer will slowly increase, yet during the first few minutes of deposition of the of the rest of the AP1 layer the temperature should not rise very much.

Figure 5:
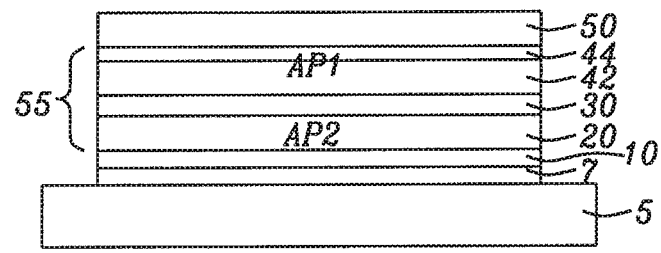
FIG. 5 is a schematic representation showing the fourth step in the fabrication of the MTJ MRAM stack of FIG. 1.

Referring now to FIG. 5, the cooling step is complete and the remaining deposition steps are carried out at ambient temperatures. However, additional cooling steps are still possible, if so desired, but they are not shown here. There is now shown the formation of the MgO tunneling barrier layer 50 on top of CoFeB layer 44. The MgO layer is between 5 and 30 A in thickness. A cooling step can also be applied at this step in the fabrication, before the MgO deposition is completed. Such a cooling step could be in addition to the one previously discussed with the formation of AP1, or it could be done instead of the one performed with the deposition of AP1. Note that the MgO may be formed by sputtering deposition of a Mg layer which is then oxidized or by direct sputtering from a target of MgO.

Figure 6:
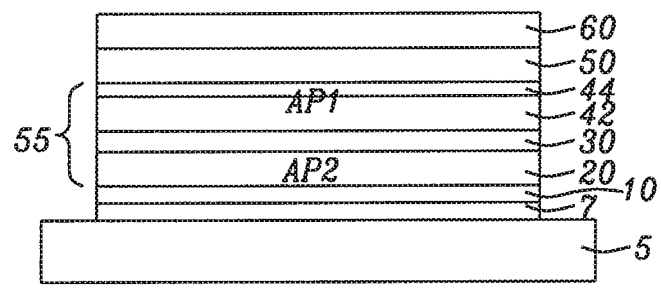
FIG. 6 is a schematic representation showing the fifth step in the fabrication of the MTJ MRAM stack of FIG. 1.

Referring next to FIG. 6, there is shown the formation of a ferromagnetic free layer 60, generally formed of CoFeB based materials and formed to a thickness of between 5 and 25 A. The cooling step can also be applied before the free layer is deposited or while the free layer is being deposited. If the cooling step is carried out during free layer deposition, the fabrication is removed to the cooling chamber before the free layer is fully deposited. Typically, such a mid-deposition cooling would be done when half of the free layer has been deposited, which would be halfway between a free layer that is generally between 5 and 25 A in thickness. Normally, the free layer is a multi-layered deposition, such as a layer of $Fe_{70}B_{30}$ followed by a layer of $Co_{20}Fe_{60}B_{20}$. In that case, the cooling would occur before deposition of the $Co_{20}Fe_{60}B_{20}$.

Figure 7:
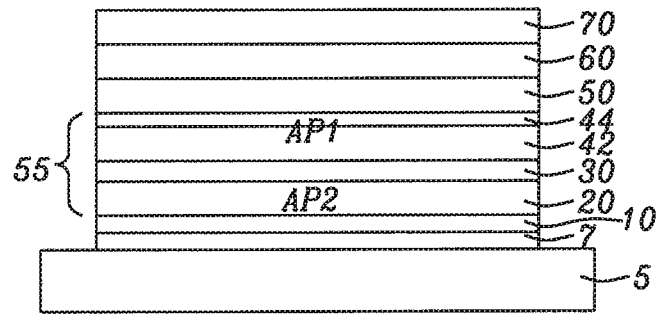
FIG. 7 is a schematic representation showing the sixth step in the fabrication of the MTJ MRAM stack of FIG. 1.

Referring next to FIG. 7, there is shown the deposition of a MgO capping layer 70 on the top of the free layer 60. Again, we note that the MgO may be formed by oxidizing a layer of Mg or by sputtering a layer of MgO. The capping layer is between 5 and 30 A in thickness and the cooling step can be applied after completion of the free layer deposition and before the capping layer deposition. Note that the cooling process can be applied as a series of processes where each cooling step is applied as noted above, before or during each deposition process after first transferring the deposition to the cooling chamber. We note also that the most appropriate fabrication step(s) for applying the cooling process may have to be discovered empirically as the particular nature of the stack seems to affect the beneficial properties of the cooling.

Figure 8:
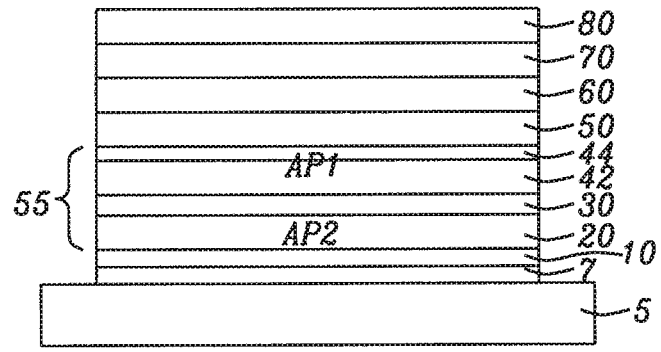
FIG. 8 is a schematic representation showing the final step in the fabrication of the MTJ MRAM stack of FIG. 1.

Referring finally to FIG. 8, there is shown the deposition of a hard mask 80 which is formed of Ta of approx. 600 A thickness and that will be used for purposes of patterning the finished stack. We also note that we do not indicate any of the various steps of annealing may be required as dictated by the necessity of integrating the devices into a larger MRAM system. These anneals do not affect the role of the cooling steps nor are they required for setting the magnetization of the RKKY interaction The beneficial results of this fabrication method can be demonstrated using reflow tests. As shown in the table below, two otherwise identical structures, but one fabricated with and one without a cooling step in forming the AP1 layer of a synthetic antiferromagnetic (SAF) pinned layer (as described below) show different error rates after a reflow process. Reflow is a chip manufacture process where the chip is soldered to the socket by heating a solid layer of solder and causing it to liquify (reflow) and it serves as the strictest requirement for thermal stability of the MTJ stack. Typically, as a result of the reflow process a chip would experience a temperature about 260 C for about 90 s and the information stored in the chip before reflow should not be lost during the process.

|  | Without cooling | With cooling |
|---|---|---|
| Error rate after reflow | 10 ppm | 1 ppm |

The test is done at the wafer level as follows. A wafer that contains more than 50 chips is inserted between two metal slabs inside an oven. The temperature of the metal slabs is at least 260 C and the wafer is inside the oven for at least 90 s. Each chip has 10 Mb MTJ units and was programmed to store either information 0 or 1 before the test. We read each chip after the test to determine the number of MTJ units whose stored information has changed during the baking process. An error rate is then calculated as the number of MTJ units that have changed their information content, divided by the total number of the MTJ devices.

The wafer fabricated without cooling shows an error rate of 10 ppm (10 errors out of 1,000,000 devices) whereas the wafer fabricated with cooing shows an error rate of only 1 ppm. The data clearly indicates significant improvement of PMA of the pinned layer from the proposed cooling step.

As is finally understood by a person skilled in the art, the preferred embodiments of the present invention are illustrative of the present invention rather than limiting of the present invention. Revisions and modifications may be made to methods, materials, structures and dimensions employed in forming and providing an MTJ MRAM cell device using a process that includes cooling the fabrication at various stages, while still forming and providing such a device and its method of formation in accord with the spirit and scope of the present invention as defined by the appended claims.

What is claimed is:

1. A method comprising:
   providing a substrate;
   forming a seed layer on the substrate;
   forming a second pinned layer on the seed layer at an ambient temperature;
   forming a first portion of a first pinned layer on the second pinned layer at the ambient temperature to form a material stack;
   after the forming of the first portion of the first pinned layer, cooling the material stack, wherein the cooling includes applying a first predetermined temperature that is lower than the ambient temperature to the material stack;
   forming a second portion of the first pinned layer on the first portion of the first pinned layer, wherein forming of the second portion of the first pinned layer on the first portion of the first pinned layer occurs without maintaining the first predetermined temperature; and
   forming a ferromagnetic free layer over the second portion of the first pinned layer, wherein the forming of the ferromagnetic free layer includes:
      forming a first ferromagnetic free layer over the second portion of the first pinned layer without cooling the first ferromagnetic free layer during the forming of the first ferromagnetic free layer, the first ferromagnetic free layer formed of a first material;
      cooling the first ferromagnetic free layer by applying a second predetermined temperature to the first ferromagnetic free; and
      forming a second ferromagnetic free layer on the first ferromagnetic free layer without maintaining the first ferromagnetic free layer at the second predetermined temperature.

2. The method of claim 1, further comprising:
   forming a tunneling barrier layer on the second portion of the first pinned layer; and forming a capping layer on the ferromagnetic free layer.

3. The method of claim 1, wherein the first portion of the first pinned layer is amorphous during the forming of the first portion of the first pinned layer on the seed layer.

4. The method of claim 1, wherein the second pinned layer having a (111) crystallographic orientation.

5. The method of claim 4, further comprising forming a coupling layer on the second pinned layer before forming the first portion of the first pinned layer.

6. The method of claim 1, wherein the second portion of the first pinned layer has a (001) crystallographic orientation.

7. The method of claim 1, wherein the second portion of the first pinned layer is a CoFeB layer.

8. A method comprising:
providing a stack of magnetic tunneling junction (MTJ) layers that includes a first pinned layer over a second pinned layer, wherein a top portion of the first pinned layer and the second pinned layer have different crystallographic orientations, and wherein the first pinned layer is exposed;
cooling the stack of MTJ layers to a first temperature;
after cooling the stack of MTJ layers, forming a first material layer on the stack of MTJ layers without maintaining the stack of MTJ layers at the first temperature, and
forming a free layer on the first material layer disposed on the stack of MTJ layers, wherein the forming of the free layer includes:
  forming a first free layer on the first material layer without cooling the first free layer during the forming of the first free layer, the first free layer formed of a first material;
  cooling the first free layer by applying a second temperature to the first free layer; and
  forming a second free layer on the first free layer without maintaining the first free layer at the second temperature, the second free layer formed of a second material that is different than the first material.

9. The method of claim 8, wherein the second pinned layer has a (111) crystallographic orientation, and wherein the top portion of the first pinned layer has a (001) crystallographic orientation.

10. The method of claim 9, wherein the stack of MTJ layers further includes:
a coupling layer disposed over the second pinned layer; and
the first pinned layer disposed over the coupling layer.

11. The method of claim 8, wherein the first material layer is a tunneling barrier layer.

12. The method of claim 8, wherein the cooling of the stack of MTJ layers to the first temperature includes:
coupling the stack of MTJ layers to a metal stage; and
applying a gas to the metal stage to thereby cool the stack of MTJ layer to the first temperature.

13. The method of claim 8, further comprising forming a second material layer over the first material layer.

14. The method of claim 13, wherein the second material layer is a MgO capping layer.

15. A method comprising:
providing a stack of magnetic tunneling junction (MTJ) layers on a substrate;
forming a free layer over the stack of MTJ layers, wherein a top surface of the free layer faces away from the substrate;
after the forming of the free layer, initiating a cooling process to cool the stack of MTJ layers to a first temperature while the top surface of the free layer is exposed, wherein the cooling the stack of MTJ layers to the first temperature includes cooling the stack of MTJ layers to at least 60° K; and
after cooling the stack of MTJ layers, forming a cap layer on the free layer without maintaining the stack of MTJ layers at the first temperature.

16. The method of claim 15, wherein the providing of the stack of MTJ layers includes:
a first pinned layer on a substrate;
a coupling layer on the first pinned layer; and
a second pinned layer on the coupling layer.

17. The method of claim 16, wherein the first pinned layer has a (111) crystallographic orientation, and wherein the second pinned layer has a (001) crystallographic orientation.

18. The method of claim 17, wherein the first pinned layer includes multiple layers of the same material.

19. The method of claim 15, wherein the cooling of the stack of MTJ layers to the first temperature includes applying Ar gas.

20. The method of claim 15, wherein without maintaining the stack of MTJ layers at the first temperature includes allowing the material stack to return to an ambient temperature.

* * * * *